US006475355B2

(12) United States Patent
Mearini et al.

(10) Patent No.: US 6,475,355 B2
(45) Date of Patent: Nov. 5, 2002

(54) PROCESS FOR COATING AMORPHOUS CARBON COATING ON TO AN X-RAY TARGET

(75) Inventors: Gerald T. Mearini, Shaker Heights; Hsiung Chen, Lyndhurst; Robert E. Kusner, Solon; Laszlo A. Takacs, Shaker Heights, all of OH (US)

(73) Assignee: GENVAC Aerospace Corp., Richmond Hts., OH (US)

( * ) Notice: Subject to any disclaimer, the term of this patent is extended or adjusted under 35 U.S.C. 154(b) by 0 days.

(21) Appl. No.: 09/940,054

(22) Filed: Aug. 27, 2001

(65) Prior Publication Data

US 2002/0034639 A1 Mar. 21, 2002

Related U.S. Application Data

(62) Division of application No. 09/474,841, filed on Dec. 30, 1999, now Pat. No. 6,301,333.

(51) Int. Cl.[7] .......... C23C 14/34
(52) U.S. Cl. .......... 204/192.15
(58) Field of Search .......... 204/192.12, 192.15

(56) References Cited

U.S. PATENT DOCUMENTS 4,335,327 A 6/1982 Waugh .......... 313/330
4,436,797 A * 3/1984 Brady et al. .......... 430/5
4,939,762 A * 7/1990 Baba et al. .......... 378/144
5,414,748 A 5/1995 Upadhya .......... 378/144
6,301,333 B1 * 10/2001 Mearini et al. .......... 378/143

* cited by examiner

*Primary Examiner*—Steven H. VerSteeg
(74) *Attorney, Agent, or Firm*—Fay, Sharpe, Fagan, Minnich & McKee, LLP

(57) ABSTRACT

A method of manufacturing an x-ray target by positioning an x-ray target having an alloy surface and a graphite surface in a sputtering chamber is disclosed. The x-ray target is then coated over the graphite surface with non-hydrogenated amorphous carbon.

9 Claims, 2 Drawing Sheets

PROCESS FOR COATING AMORPHOUS CARBON COATING ON TO AN X-RAY TARGET

RELATED APPLICATIONS

This application is a divisional application of U.S. application Ser. No. 09/474,841, which was filed on Dec. 30, 1999, and has now matured into U.S. Pat. No. 6,301,333 on Oct. 9, 2001.

BACKGROUND OF THE INVENTION

This invention relates to an x-ray tube anode target and, to a coating on an x-ray tube anode target. More particularly, this invention relates to an x-ray tube target including an amorphous carbon coating. Furthermore, the invention relates to a process for forming the coating.

Ordinarily, an x-ray beam generating device, referred to as an x-ray tube or target, includes dual electrodes in an evacuated chamber. One of the electrodes is a thermionic emitter cathode which is positioned in the tube in a spaced relationship to a target anode. Upon energization of an electrical circuit, the cathode is electrically heated to generate a stream or beam of electrons directed towards the x-ray target anode. The electron stream is appropriately focused as a thin beam of very high velocity electrons striking the target anode surface. The anode surface is usually constructed of a refractory metal so that the kinetic energy of the striking electrons against the target material is converted to electromagnetic waves of very high frequency, i.e., x-rays which radiate from the target and are collimated and focused for penetration into an object, usually for internal examination purposes. Well known primary refractory metals for the anode target surface area exposed to the impinging electron beam include tungsten, molybdenum, and their many alloys.

The high velocity beam of electrons impinging the target surface generates extremely high and localized temperatures in the target structure accompanied by high internal stresses leading to deterioration and break down of the target structure. As a consequence, it has become routine to use a rotating disk shaped anode target, one side or face of which is exposed to the electron beam from the thermionic emitter cathode. By means of target rotation, the impinged region of the target is continuously changing to avoid localized heat concentration and stresses and to better distribute the heating effects throughout the structure. Accordingly, rotation of targets for improved heat dissipation has reached target speeds exceeding 10,000 RPM. Nonetheless, heating remains a major problem in x-ray anode target structures.

A target body is chosen from a material with a high heat storage capacity. Moreover, only about 1% of the energy of the impinging electron beams convert to x-rays with the remainder appearing as heat which must be rapidly dissipated from the target by means of heat radiation. One preferred material for the rotating disk-like anode target body is graphite which has a high heat storage capacity and which readily accepts bonding to a refractory metal layer such as the cathode electron beam impinging surface. Accordingly, significant technological efforts are expended towards improving heat dissipation from x-ray anode target surfaces.

Methods for dealing with heat stress are provided by various techniques, such as U.S. Pat. No. 4,939,762, herein incorporated by reference, wherein a tungsten-rhenium alloy is coated on a graphite body to protect the x-ray generating metal from any excessive thermal load. More particularly, to address the problem of peel away of the x-ray generating metal coating, the utilization of a metal interlayer between a tungsten containing x-ray generating metal coating and the graphite body is taught.

In U.S. Pat. No. 5,414,748, herein incorporated by reference, another method used to treat heat related problems associated with x-ray targets is disclosed. It is taught that the x-ray tube include a circular graphite body having a circular metal alloy target section disk concentrically bonded to the graphite body, the target section disk has a peripheral axial rim surface. A high heat emissive hafnium carbide coating is then deposited on the rim of the target section disk to improve heat emission.

SUMMARY OF THE INVENTION

According to one embodiment of this invention a new and improved x-ray target is provided.

An advantage of this invention is to provide a new and improved process for the manufacture of an x-ray target.

Another advantage of the present invention is to provide an x-ray target having a graphite body with increased heat emissivity and prolonged life.

Additional advantages of the invention will be set forth in part in the description which follows and in part will be obvious from the description, or may be learned by practice of the invention. The advantages of the invention may be realized and attained by means of the instrumentalities and combinations particularly pointed out in the appended claims.

According to one embodiment of the invention, the process of this invention comprises positioning an x-ray target having a graphite body and an x-ray generating metal coating layer into a vacuum system. The x-ray target is positioned with the graphite body facing a graphite sputtering target. The x-ray target is rotated and sufficient energy is applied to the sputtering target to displace carbon atoms into the atmosphere. An inert, preferably large molecule gas, is included in the sputtering atmosphere to facilitate the displacement of carbon atoms from the sputtering target. The displaced carbon atoms are deposited on the x-ray target to form an amorphous carbon coating.

BRIEF DESCRIPTION OF THE DRAWINGS

The invention consists in the novel parts, construction, arrangements, combinations and improvements, shown and described. The accompanying drawings, which are incorporated in and constitute a part of the specification illustrate one embodiment in the invention, and, together with the description, serve to help illustrate the principles of the invention.

Of the Drawings.

DETAILED DESCRIPTION OF THE INVENTION

Reference will now be made in detail to one embodiment of the invention, an example of which is illustrated in the associated drawings. While the invention and inventive process will be described in connection with one embodiment, it will be understood that it is not intended to limit the invention to that embodiment. On the contrary, it is intended to cover all alternatives, modifications and equivalents as may be included within the spirit and scope of the invention defined by the appended claims.

Figure 1:
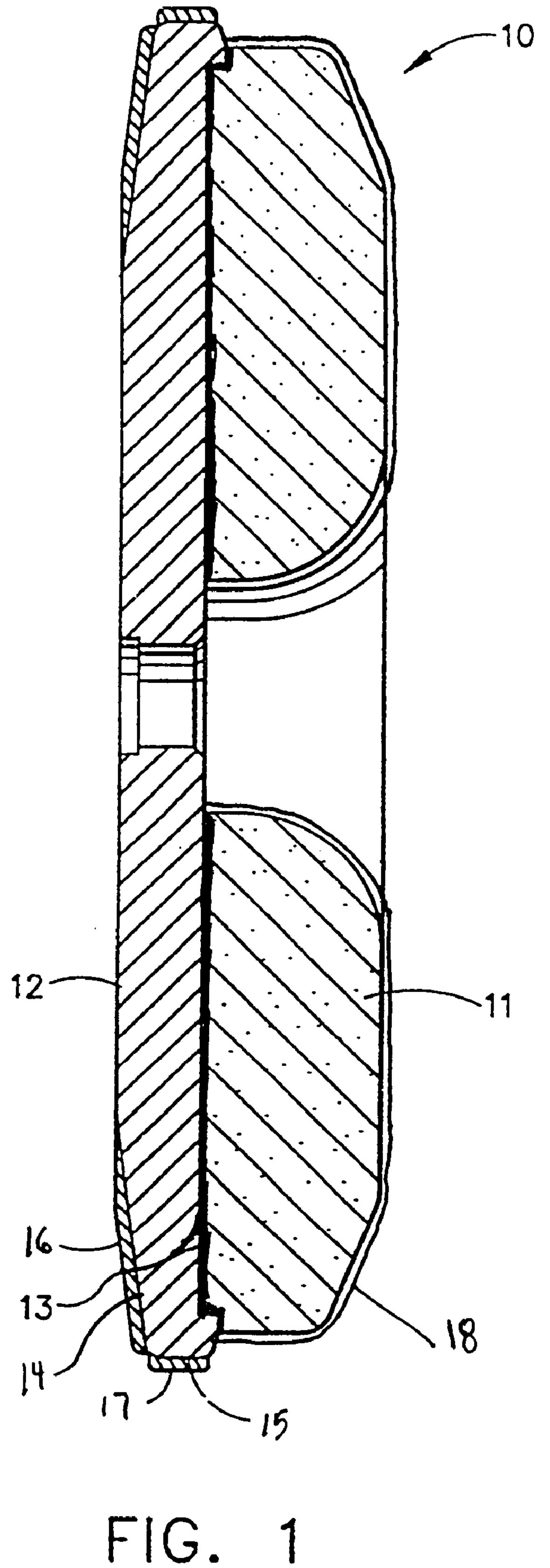
FIG. 1 is a cross-sectional view of an exemplary x-ray target structure with the inventive amorphous carbon coating disposed thereon.

Referring now to FIG. 1, the x-ray anode target 10 includes a disc-like body 11 of a high heat resistant material such as graphite. A thinner concentric circular disc-like metal target section 12 is bonded to graphite body 11. The x-ray generating metal target section 12 is preferably attached via a metal interlayer 13 between the graphite body 11 and metal target section 12. Preferably, the thickness of the x-ray generating metal target section 12 is greater than the depth to which the electron beam reaches. Since the depth of the penetration of the electron beams is about 10 to 15 microns, the thickness of the x-ray generating metal target section is preferably set greater than 20 microns. The exposed face of target section 12 includes an annular beveled edge 14 with a narrow peripheral axial surface 15. Annular beveled section 14 is coated with a heat emissive layer 16. In addition, a heat emissive coating 17 is deposited on peripheral surface 15. The present invention includes the addition of amorphous carbon layer 18 on graphite body 11.

It has been found that the thin non-hydrogenated amorphous carbon coating 18, having a thickness between 1.0 and 20.0 microns, preferably between 1.6 and 2.0 microns, i) allows out gassing during firing prior to insertion to the tube;

ii) seals the surface of the graphite heat sink to prevent undesirable flaking during the operation of the x-ray tube;

iii) increases the emissivity of the graphite heat sink above that of the uncoated heat sinks for improved heat dissipation; and, iv) improves the life of the x-ray target.

As seen in FIG. 1, the graphite body 11 is intricately machined to maximize the surface area and in turn increase the thermal dissipation properties. The machined surface of the graphite has shown evidence of flaking and release of gas through an initial seasoning of the target after it has been mounted into the tube assembly. Since the tube is evacuated to $10^8$ torr, this flaking and outgassing can compromise the integrity of the tube.

The present coating of non-hydrogenated amorphous carbon allows outgassing prior to insertion into the tube, reduces flaking from the graphite surface, and improves the thermal dissipation properties without changing any of the other beneficial properties of using the graphite body.

Figure 2:
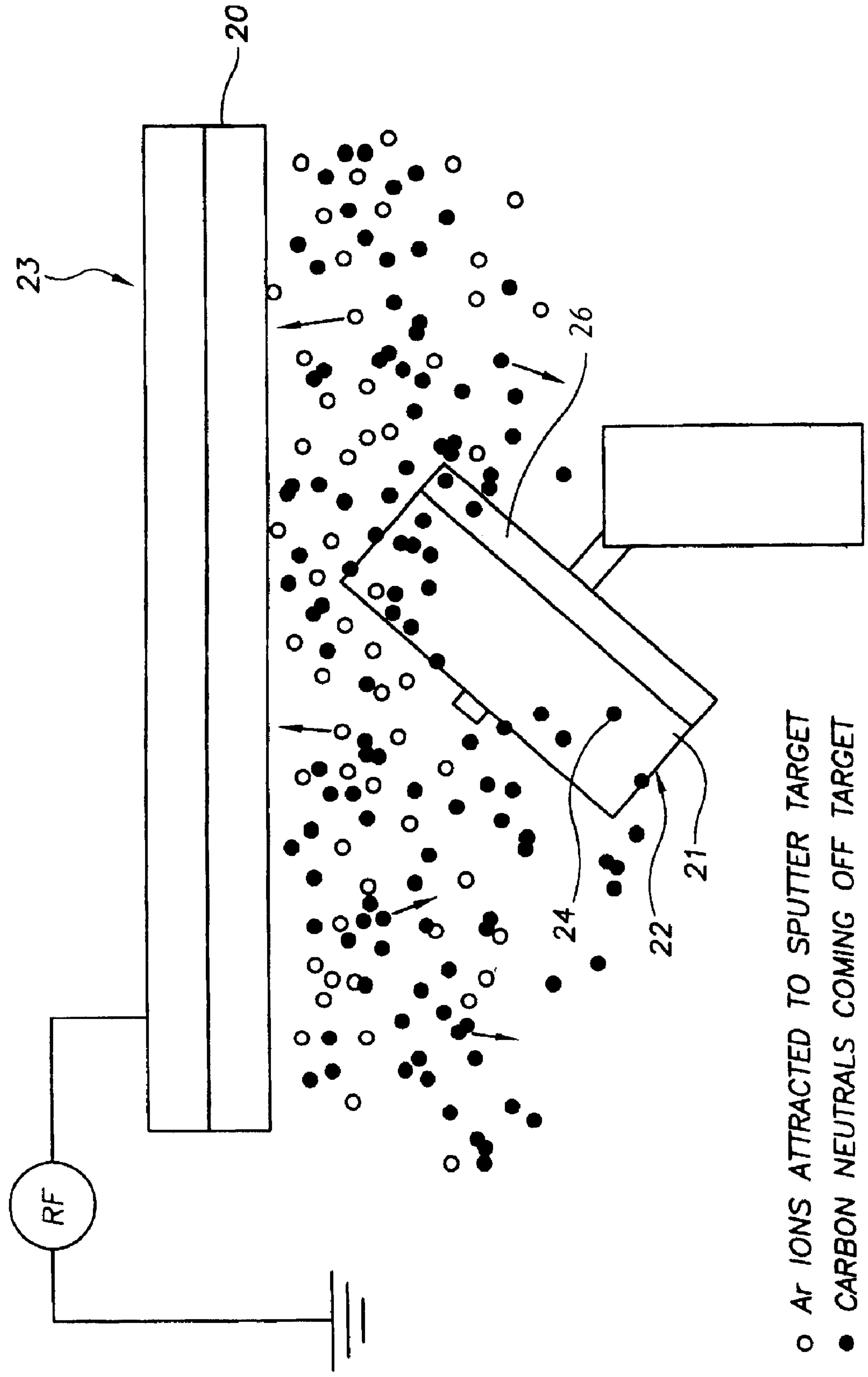
FIG. 2 is a schematic representation of one embodiment of the present sputtering system.

Referring now to FIG. 2, the process by which the above-described amorphous non-hydrogenated carbon coating is formed is-described. Of course, the process is not limited to the specific sputtering procedures outlined above. Rather, other physical deposition processes and sputtering techniques known to those of ordinary skill in the art may be substituted for the inventive procedure. A piece of graphite 20, preferably from the same stock used to manufacture the graphite body 21 of x-ray target 22, or a substantial chemical equivalent thereof, is machined to a shape to be mounted into a sputtering chamber (not shown) to be used as source of carbon for the thin film coating process. More specifically, the piece of graphite 20 is used as the active surface of the sputtering target 23. The sputtering device is preferably a sputtering gun of an RF or DC magnetron variety. Examples of commercially available and suitable units include Torus Magnetrons.

The x-ray target 22 is placed with the graphite body 21 of the x-ray facing the sputtering target 23, and preferably no less than 2.5" from the sputtering target graphite surface 20. Preferably, the x-ray target 22 is held at ground potential, but an electric bias may be used to repel ions. The x-ray target 22 is typically covered with a precision mask to prevent the coating from depositing on that surface. Accordingly, the active metal surface 26 of the x-ray target 22 is directed away from the sputtering target 23, and a coating 24 begins to form primarily on graphite body 21.

More specifically, after the x-ray target 22 is loaded, the vacuum system is pumped to a base pressure of between 5 to $9\times10^6$ torr. After reaching the base pressure, the system is back filled with high purity argon to 10 milliton by filling argon at 40 sccm and throttling the high vacuum valve on a main pump to adjust the pumping speed. Forward RF power is adjusted in the sputter gun to give a self rectified DC bias of 3.6 kv. The x-ray target is rotated at a rate of e.g. 0.1 to 5 RPM, under the sputter gun to allow coating of the entire exposed graphite surface of the target. The deposition is allowed to run for 3 to 12 hours to achieve a hard, non-hydrogenated amorphous carbon coating 1.6 to 2.0 microns thick covering the surface of the graphite body of the x-ray target. Of course, it is noted that the deposition time of 3 to 12 hours can be shortened by utilizing a higher wattage sputtering system or a DC sputter source.

Thus, it is apparent that there has been provided in accordance with the invention, a method for manufacturing a graphite x-ray target that fully satisfies the objects, aims and advantages set forth above. While the invention has been described in conjunction with the specific embodiments thereof, it is evident that many alternatives, modifications and variations will be apparent to those skilled in the art in light of the foregoing description. Accordingly, it is intended to embrace all such alternatives, modifications and variations as fall within the spirit and broad scope of the appended claims.

What is claimed:

1. A method of forming a coating on an x-ray target comprising:

positioning an x-ray target including an alloy target section and a graphite section within a sputtering chamber and sputter depositing a non-hydrogenated amorphopus carbon coating over at least a portion of the graphite section.

2. The method of claim 1 wherein a carbon sputtering target is used.

3. The method of claim 2 wherein said graphite section and said carbon sputtering target are substantially chemically equivalent.

4. The method of claim 1 wherein said sputtering chamber is operated at a pressure of less than about 5 millitorr.

5. The method of claim 1 wherein an RF or DC magnetron sputtering gun is used.

6. The method of claim 1 wherein argon provides a source of sputtering ions.

7. The method of claim 1 wherein said x-ray target is rotated during the sputter depositing.

8. The method of claim 1 being performed until the carbon coating is between about 1.6 and 2.0 microns in depth.

9. The method of claim 1 continued for 3 to 12 hours.

* * * * *